US009461234B2

(12) United States Patent
Mayer et al.

(10) Patent No.: US 9,461,234 B2
(45) Date of Patent: Oct. 4, 2016

(54) MANUFACTURING METHOD FOR A PIEZOELECTRIC LAYER ARRANGEMENT AND CORRESPONDING PIEZOELECTRIC LAYER ARRANGEMENT

(71) Applicant: Robert Bosch GmbH, Stuttgart (DE)

(72) Inventors: Thomas Mayer, Reutlingen (DE); Juergen Butz, Reutlingen (DE); Rainer Straub, Ammerbuch (DE); Jochen Tomaschko, Herrenberg (DE); Christof Single, Kusterdingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 14/814,182

(22) Filed: Jul. 30, 2015

(65) Prior Publication Data
US 2016/0035959 A1 Feb. 4, 2016

(30) Foreign Application Priority Data

Jul. 30, 2014 (DE) .................. 10 2014 215 009

(51) Int. Cl.
| H01L 41/083 | (2006.01) |
| H01L 41/337 | (2013.01) |
| H01L 41/04 | (2006.01) |
| H01L 41/047 | (2006.01) |
| H01L 41/09 | (2006.01) |
| H01L 41/113 | (2006.01) |
| H01L 41/187 | (2006.01) |
| H01L 41/29 | (2013.01) |
| H01L 41/314 | (2013.01) |

(52) U.S. Cl.
CPC ............ *H01L 41/04* (2013.01); *H01L 41/047* (2013.01); *H01L 41/0926* (2013.01); *H01L 41/1132* (2013.01); *H01L 41/1876* (2013.01); *H01L 41/29* (2013.01); *H01L 41/314* (2013.01); *H01L 41/337* (2013.01)

(58) Field of Classification Search
CPC .......................................... H01L 41/00–41/47
See application file for complete search history.

(56) References Cited

U.S. PATENT DOCUMENTS 6,158,847 A * 12/2000 Usui .................... B41J 2/14233
347/70
7,164,179 B2 1/2007 Nakanishi et al.

\* cited by examiner

*Primary Examiner* — Daniel Shook
(74) *Attorney, Agent, or Firm* — Norton Rose Fulbright US LLP

(57) ABSTRACT

A manufacturing method is provided for a piezoelectric layer arrangement and a corresponding piezoelectric layer arrangement. The manufacturing method includes the steps: depositing a first electrode layer on a substrate; depositing a first insulating layer on the first electrode layer; forming a through opening in the first insulating layer to expose the first electrode layer within the through opening; depositing a piezoelectric layer on the first insulating layer and on the first electrode layer within the through opening; back-polishing the resulting structure to form a planar surface, on which a piezoelectric layer area, surrounded by the first insulating layer, is exposed; and depositing and structuring a second electrode layer on the first insulating layer, which contacts the piezoelectric layer area.

15 Claims, 5 Drawing Sheets

MANUFACTURING METHOD FOR A PIEZOELECTRIC LAYER ARRANGEMENT AND CORRESPONDING PIEZOELECTRIC LAYER ARRANGEMENT

FIELD OF THE INVENTION

The present invention relates to a manufacturing method for a piezoelectrical layer arrangement and a corresponding piezoelectrical layer arrangement.

BACKGROUND INFORMATION

Piezoelectric materials, in particular PZT (lead-zirconate-titanate), are used in the technology of non-volatile memory devices (FeRAM) and also as actuator and sensor materials in micromechanics.

Although not limited to this, the present invention and the underlying problem will be explained on the basis of PZT.

FIG. 5 shows a schematic cross-sectional presentation of an exemplary piezoelectric PZT layer arrangement as is known from U.S. Pat. No. 7,164,179 B2.

In FIG. 5, reference numeral 1 designates a semiconductor substrate, for example a silicon semiconductor substrate. A layer stack made up of an adhesion/barrier layer 2a, a lower electrode layer 2b, and an optional seed layer 2c, collectively designated with reference numeral 2, is applied to the upper side OS of semiconductor substrate 1. This layer stack 2, and a PZT layer 40 positioned thereabove with an upper electrode 5, are deposited across the entire surface on semiconductor substrate 1 and are structured with the aid of photolithography and subsequent etching processes.

A typical height h1 of layer stack 2 is 50 nm to 500 nm (nanometers), a typical height h2 of PZT layer 40 is 1 μm to 5 μm (micrometers), and a typical height h3 of upper electrode 5 is 50 nm to 400 nm (nanometers).

By using PZT thin-layer multi-stacks in the area of mechanical actuators, it is possible to increase the mechanical deflection at lower operating voltages. When used as sensor material, the sensitivity for the detection of mechanical deformations may be increased in this way.

Layer heights h1, h2, and h3 of the electrodes and additional auxiliary layers required for use as actuator material result in a topography of >1 μm, which prevents integration into modern CMOS processes which depend on planar surfaces. In addition, the manufacture of PZT thin-layer multi-stacks is made more difficult by a topography of this type.

SUMMARY

The present invention creates a manufacturing method for a piezoelectric layer arrangement and a corresponding piezoelectric layer arrangement.

The underlying idea of the present invention is the manufacture of a piezoelectric layer arrangement with the aid of a structured insulation material, for example oxide, in combination with a CMP step (chemical mechanical polishing), also known as a damascene process. Thereby, topography-free surfaces may be generated, which enables additional processing in modern ASIC processes and in turn enable a monolithic integration of ASIC- and actuator or sensor materials into one chip.

According to one preferred specific embodiment, the first electrode layer is structured prior to the deposition of a piezoelectric layer. A structuring prior to the later deposition of the piezoelectric layer has the advantage that, for example, a wiring level may be implemented using the lower electrode layer.

According to one additional preferred specific embodiment, a seed layer is deposited on the first insulating layer prior to forming the through opening, or a seed layer is deposited after forming the through opening, which covers the upper side of the insulating layer or the upper side of the insulating layer and the side walls of the through opening, the piezoelectric layer being deposited on the seed layer and on the first electrode layer within the through opening. This enables a formation of the piezoelectric layer which is free of crystal defects.

According to one additional preferred specific embodiment, the back-polishing is stopped on the seed layer. This enables a precise polishing stop.

According to one additional preferred specific embodiment, the seed layer on the first insulating layer is structured, together with the second electrode layer, after the back-polishing.

According to one additional preferred specific embodiment, the seed layer is removed after the back-polishing and the piezoelectric layer area is back-thinned. In this way, any crystal defects in the upper part of the piezoelectric layer area may be removed.

According to one additional preferred specific embodiment, a second insulating layer is deposited on the first insulating layer and the first electrode layer. This may serve as a protective layer or as a basis for an additional damascene step.

According to one additional preferred specific embodiment, a first contact hole to the first electrode layer is formed in the first and second insulating layers and a second contact hole to the second electrode layer is formed in the second insulating layer. The electrode layers may thus be contacted in parallel from the upper side.

According to one additional preferred specific embodiment, prior to opening the contact holes, an additional through opening is formed in the second insulating layer to expose the second electrode layer within the additional through opening, an additional piezoelectric layer being formed on the second insulating layer and on the second electrode layer within the additional through opening; the resulting structure for forming an additional planar surface on which an additional piezoelectric layer area, surrounded by the second insulating layer, is exposed and back polished; and a third electrode layer which contacts the additional piezoelectric layer area, is deposited and structured. In this way, multi-stacks may be manufactured consecutively using analog process steps.

According to one additional preferred specific embodiment, a third insulating layer is deposited on the second insulating layer and the third electrode layer. This may in turn serve as a protective layer or as the basis for an additional damascene step.

According to one additional preferred specific embodiment, at least one additional piezoelectric layer area, surrounded by the third insulating layer, is formed on the third electrode layer.

According to one additional preferred specific embodiment, the first electrode layer and/or the second electrode layer and/or the third electrode layer is/are formed as a layer stack. This increases adhesive strength.

DETAILED DESCRIPTION

Figure 1A:
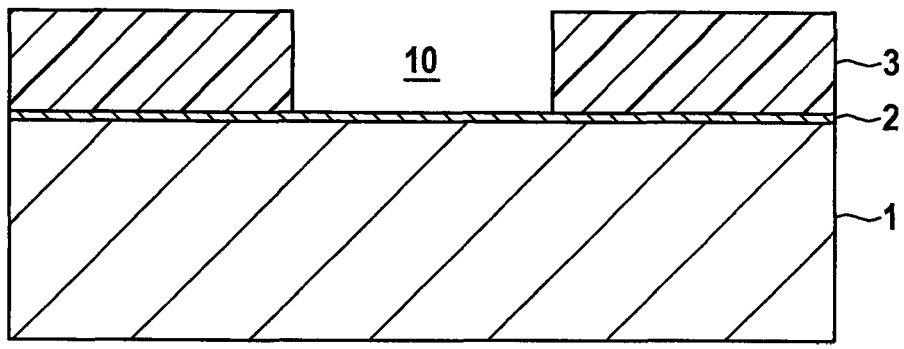
FIGS. 1a through f show schematic cross-sectional representations of method stages of a manufacturing method for a piezoelectric layer arrangement according to a first specific embodiment of the present invention.

In the figures, identical reference numerals designate identical or functionally identical elements.

FIGS. 1a through f show schematic cross-sectional representations of method stages of a manufacturing method for a piezoelectric layer arrangement according to a first specific embodiment of the present invention.

In FIG. 1a, reference numeral 1 designates a silicon wafer substrate, on which the adhesion/barrier and seed layers necessary for the PZT layer are applied in a first process step. These layers are usually made of silicon dioxide as an insulator, followed by a titanium-titanium oxide adhesion layer, alternatively tantalum or tantalum pentoxide, and a platinum layer as the lower electrode, which simultaneously serves as the seed layer. For reasons of clarity, these layers are designated collectively in the following with reference numeral 2 as the lower electrode layer.

Lower electrode layer 2 may be deposited across the entire surface as a layer stack and structured either at the beginning or later in the process sequence using suitable etching processes.

Structuring prior to the later deposition of the PZT layer has the advantage that, for example, a wiring level may be implemented using the platinum of lower electrode layer 2 in order to later establish an electrical contact to the piezoelectric actuator. Structuring of the platinum may take place, for example, using ion beam etching.

Insulating layer 3, for example made of silicon dioxide, is deposited on lower electrode layer 2. In case the surface of insulating layer 3 already has a topography of more than 100 nm due to the underlying structural layers, this topography should be removed with the aid of an intermediate chemical-mechanical-polishing step (CMP). This intermediate step is, however, optional. The thickness of remaining insulating layer 3 defines the later layer height of the piezoelectric layer area and must be accordingly adjusted. Typical layer thicknesses lie in the range from 500 nm to 5 μm.

With further reference to FIG. 1a, insulating layer 3 is subsequently structured with the aid of photolithography and etching processes. Thus, a through opening 10 is created in which insulating layer 3 is completely removed and lower electrode layer 2 is exposed.

Figure 1B:
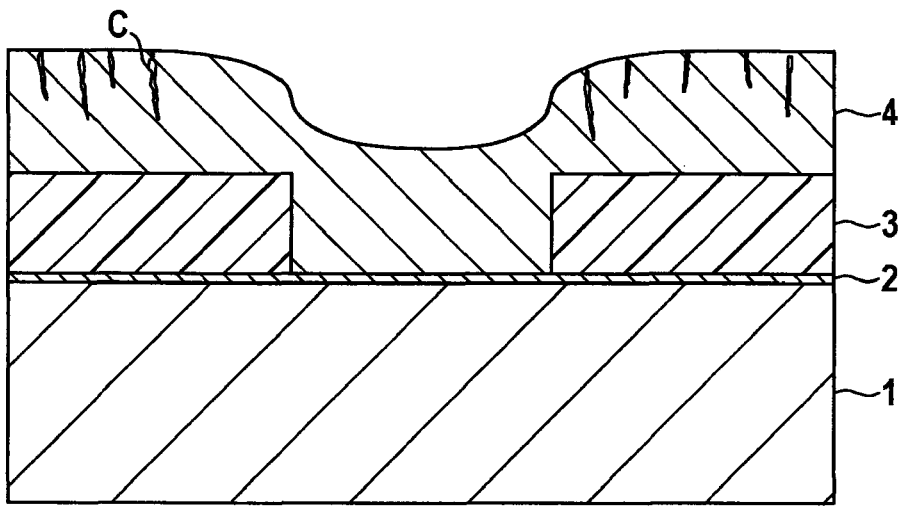

With further reference to FIG. 1b, in the next process step, a piezoelectric layer 4, in this case a PZT layer, is deposited across the entire surface. As a method, pulsed laser deposition (PLD), hydrogen-fluoride physical vapor deposition or sputtering (HF-PVD), metal organic chemical vapor deposition (MOCVD), or a sol-gel (CSD) process may be used for this purpose. The deposited layer thickness of piezoelectric layer 4 should be thereby greater than that of previously deposited insulating layer 3.

In those areas on insulating layer 3, in which piezoelectric layer 4 grows without a subjacent seed layer (in this case platinum), interferences may thereby arise in the crystal structure, as indicated by small cracks C in FIG. 1b. These cracks C are, however, removed again in a following process step. Possible (not shown) micro-cracks at the sides of through opening 10 are likewise non-critical.

Figure 1C:
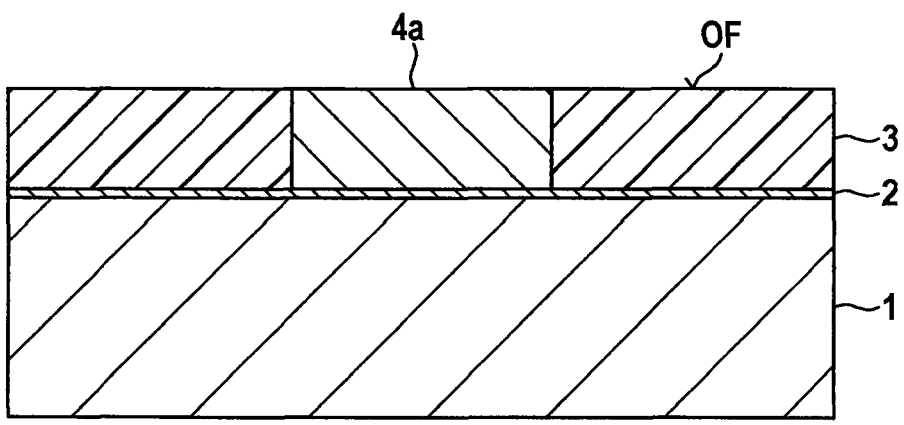

With further reference to FIG. 1c, a structuring of piezoelectric layer 4 is carried out in that the piezoelectric material is removed with the aid of chemical-mechanical polishing from insulating layer 3 outside of through opening 10. In this case, it is advantageous to select a CMP slurry which provides a preferably high selectivity between the piezoelectric material and the material of insulating layer 3. As shown in FIG. 1c, after this structuring process, a topography-free planar surface OF is present on which piezoelectric PZT layer area 4a, surrounded by insulating layer 3, is exposed.

Figure 1D:
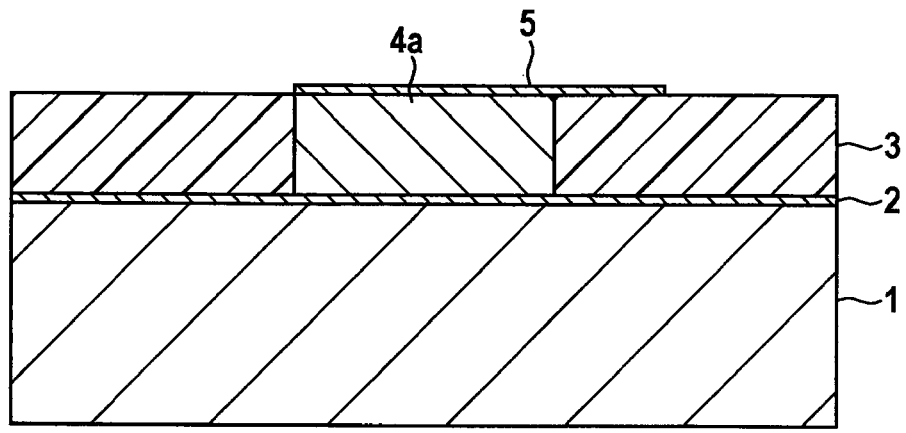

As shown in FIG. 1d, upper electrode layer 5, which is likewise preferably made of platinum, is deposited and structured in an additional process step.

According to FIG. 1e, a second insulating layer 6, which is likewise made of silicon dioxide or also silicon nitride, is subsequently deposited on the resulting structure. Aluminum oxide or aluminum nitride may also be used as alternative passivations.

Figure 1E:
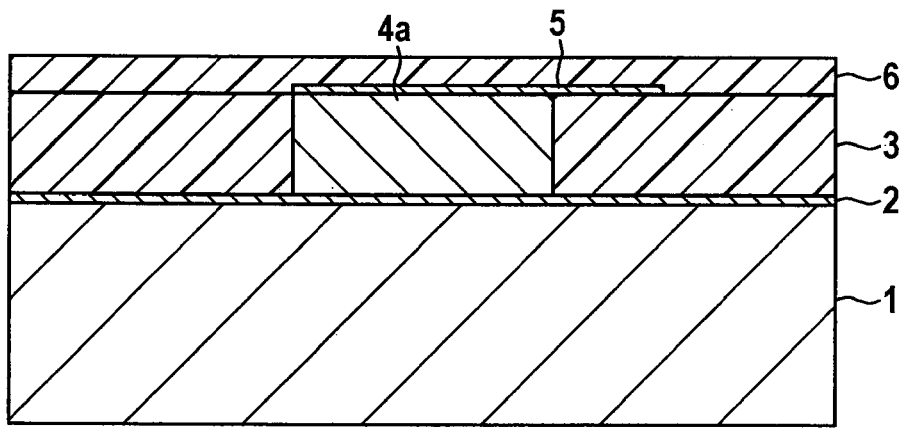
Figure 1F:
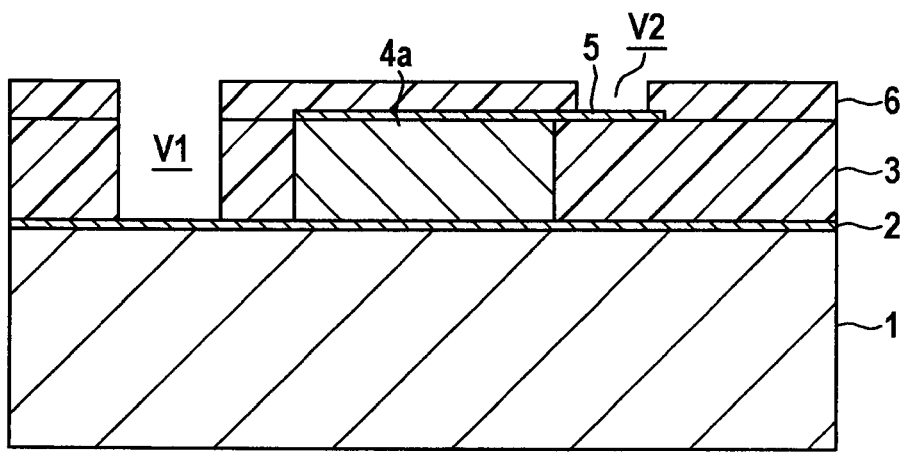

Finally, with reference to FIG. 1f, contact holes V1, V2 to lower electrode layer 2 or to upper electrode layer 5 are etched in insulating layers 3, 6.

FIGS. 2a through d show schematic cross-sectional representations of method stages of a manufacturing method for a piezoelectric layer arrangement according to a second specific embodiment of the present invention.

Figure 2A:
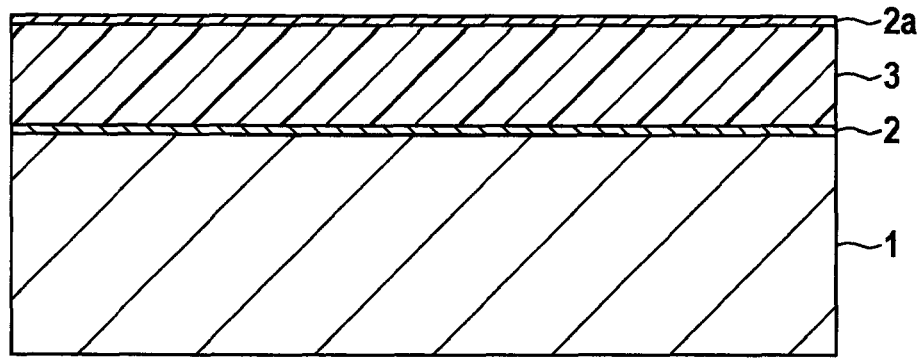
FIGS. 2a through d show schematic cross-sectional representations of method stages of a manufacturing method for a piezoelectric layer arrangement according to a second specific embodiment of the present invention.

With regard to the second specific embodiment, according to FIG. 2a, a barrier layer/seed layer-electrode stack is deposited on unstructured first insulating layer 3 as seed layer 2a for the PZT growth. Thereby, after forming through opening 10, the same conditions are established for the growth of the piezoelectric layer on insulating layer 3 as within through opening 10, as shown in FIG. 2b.

Figure 2B:
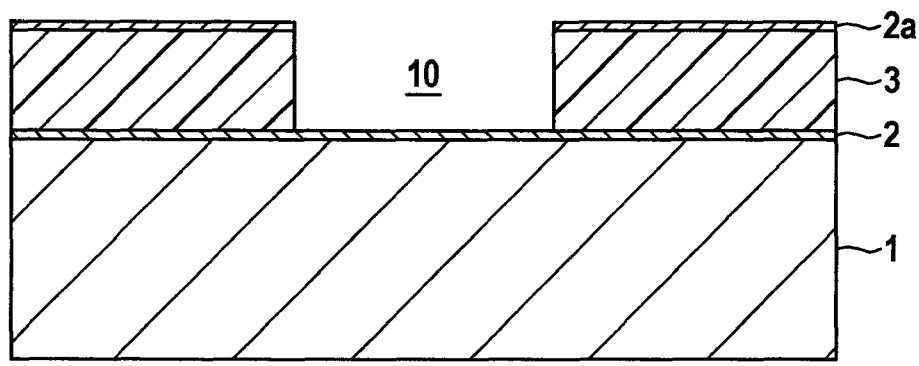
Figure 2C:
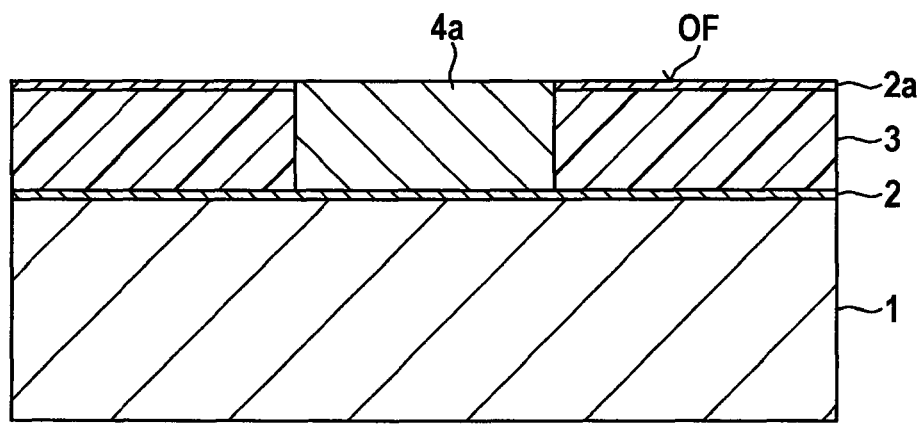

With further reference to FIG. 2c, piezoelectric layer 4 is deposited across the structure from FIG. 2b and planarized up to the surface of seed layer 2a so that a planar, topography-free surface OF may also be formed in this case.

In the case that the uppermost layer of seed layer 2a is a platinum layer, a CMP slurry is selected in this case which has a high level of selectivity of piezoelectric material to platinum.

Figure 2D:
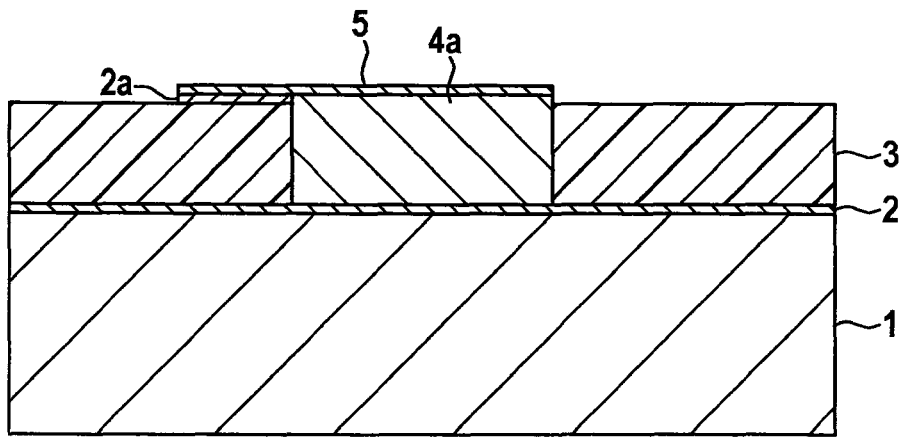

After the planarization, according to FIG. 2d, upper electrode layer 5 is deposited across the resulting structure and structured, together with seed layer 2a, with the aid of photolithography and an etching step.

As in the first specific embodiment, after reaching the state of FIG. 2d in the second specific embodiment, a second insulating layer 6 may be deposited and structured to form contact holes.

Figure 3:
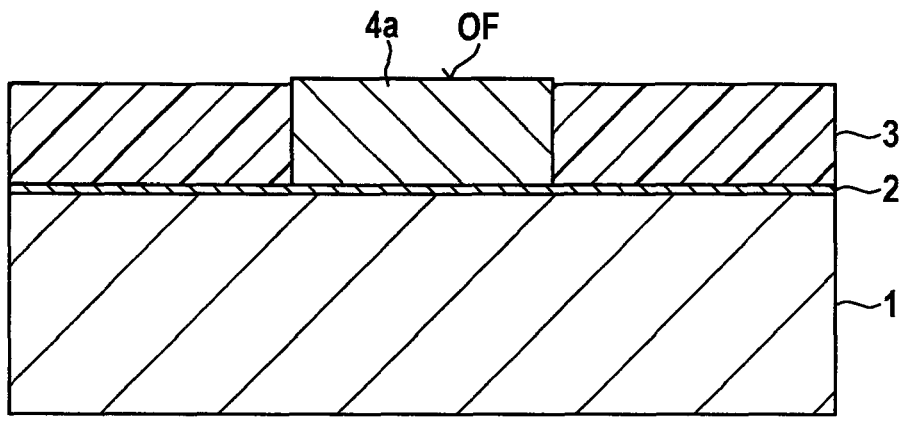
FIG. 3 shows a schematic cross-sectional representation of a method stage of a manufacturing method for a piezoelectric layer arrangement according to a third specific embodiment of the present invention.

FIG. 3 shows a schematic cross-sectional representation of a method stage of a manufacturing method for a piezoelectric layer arrangement according to a third specific embodiment of the present invention.

In the third specific embodiment, according to FIG. 3, starting from the process state according to FIG. 2c, an entire surface etching of seed layer 2a is carried out and the upper boundary surface of piezoelectric layer area 4a is also back-thinned thereby. This process is advantageous, if a damaged area is generated in piezoelectric layer area 4a by the CMP polishing, because a damaged zone of this type may impair the piezoelectric characteristics, which represents an undesirable effect. It is advantageous to use an ion beam etching method or another plasma etching method for the etching method, whereby the etching rates should be suitably adjusted to the different materials.

The remaining process steps of the third specific embodiment correspond to the process steps already described in conjunction with the first and second specific embodiments.

Figure 4A:
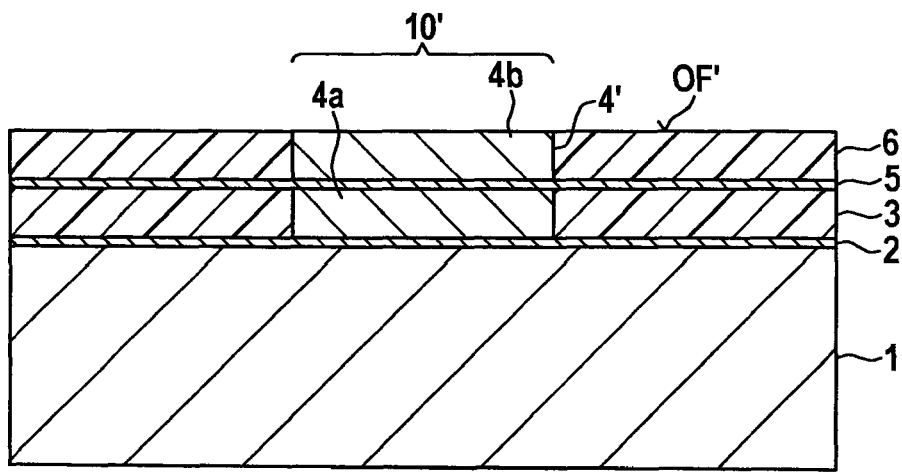
FIGS. 4a, b show schematic cross-sectional representations of method stages of a manufacturing method for a piezoelectric layer arrangement according to a fourth specific embodiment of the present invention.

FIGS. 4a, b show schematic cross-sectional representations of method stages of a manufacturing method for a piezoelectric layer arrangement according to a fourth specific embodiment of the present invention.

In the fourth specific embodiment, a topography-free piezoelectric multi-stack is manufactured in conjunction with the process steps explained with respect to the first through third specific embodiments. These multi-stacks are already used in bulk PZT materials with dimensions in the centimeter range. The advantage of these multi-stacks is a parallel connection of many piezoelectric layers, which, in the case of an actuator at the same applied voltage, may obtain higher deformations. In use as sensor material, a higher charge displacement is obtained during mechanical deformation, which results in a higher resolution of the sensor.

To manufacture this type of multi-stack, starting from the process state according to FIG. 1e, an additional through opening 10' is etched in second insulating layer 6 so that upper electrode layer 5 is exposed within through opening 10' and in turn the overhead platinum serves as a seed layer for a subsequent layer deposition of an additional piezoelectric layer 4'.

After the deposition of additional piezoelectric layer 4', in this case likewise a PZT layer, a chemical-mechanical polishing, as already explained, of piezoelectric layer 4' is carried out, during which the upper side of second insulating layer 6 is exposed so that additional piezoelectric layer area 4b, located within through opening 10', forms an additional topography-free surface OF' together with the second insulating layer.

Figure 4B:
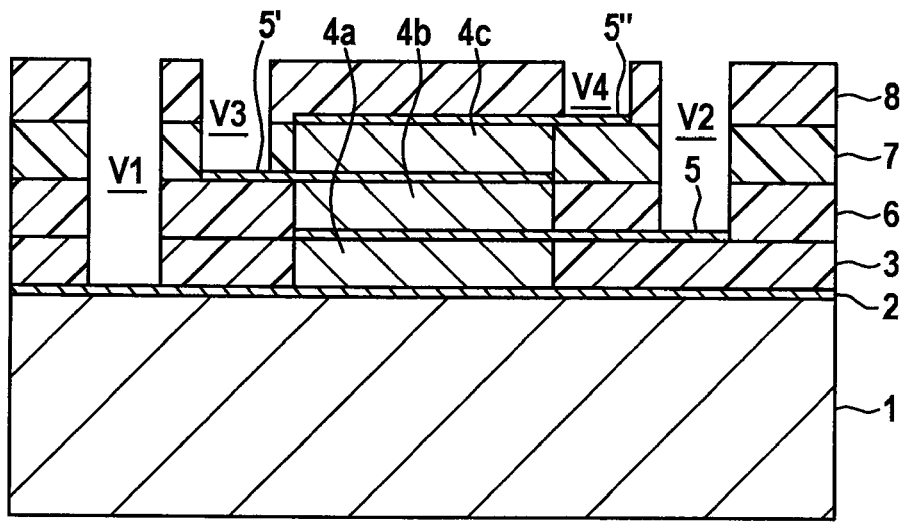
Figure 5:
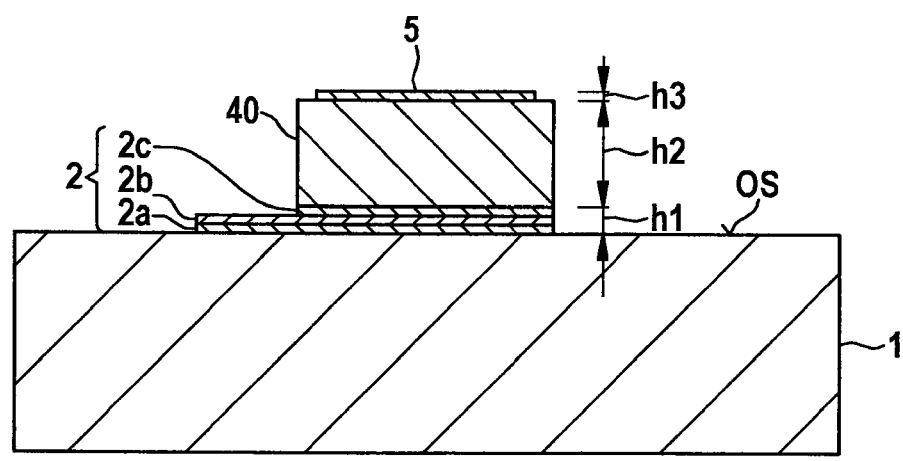
FIG. 5 shows a schematic cross-sectional representation of an exemplary piezoelectric PZT layer arrangement as is known from U.S. Pat. No. 7,164,179 B2.

With additional reference to FIG. 4b, an additional upper electrode layer 5' may be formed on second piezoelectric area 4b, which simultaneously serves as a seed layer for a redeposition of a piezoelectric layer and subsequent structuring for forming a third piezoelectric area 4c, which is embedded in a third insulating layer 7.

After subsequent forming of yet another upper electrode layer 5", the deposition of a fourth insulating layer 8 is carried out, in which contact holes V1, V2, V3, V4 are etched, which make electrode layers 2, 5, 5', and 5" electrically contactable, for example by later introduction of corresponding contact plugs made of metal.

The process sequence of alternating stacking of piezoelectric layer areas and intermediate electrode layers, which serve as seed layers, may be repeated any number of times until the desired number of piezoelectric layers is deposited in order to obtain the desired stack height.

Although the present invention has been completely described above on the basis of preferred exemplary embodiments, it is not limited thereto, and instead may be modified in many ways.

In particular, the above-mentioned piezoelectric layer materials, insulating materials, and electrode materials are only examples and each may be selected corresponding to the application.

What is claimed is:

1. A manufacturing method for a piezoelectric layer arrangement, comprising:
    depositing a first electrode layer on a substrate;
    depositing a first insulating layer on the first electrode layer;
    forming a through opening in the first insulating layer to expose the first electrode layer within the through opening;
    depositing a piezoelectric layer on the first insulating layer and on the first electrode layer within the through opening in order to produce a resulting structure;
    back-polishing the resulting structure to form a planar surface, on which a piezoelectric layer area surrounded by the first insulating layer is exposed; and
    depositing and structuring a second electrode layer on the first insulating layer, the second electrode layer contacting the piezoelectric layer area.

2. The manufacturing method as recited in claim 1, wherein the first electrode layer is structured prior to the deposition of the piezoelectric layer.

3. The manufacturing method as recited in claim 1, further comprising:
    one of depositing a seed layer on the first insulating layer prior to forming the through opening, and depositing the seed layer after forming the through opening, wherein one of the seed layer covers an upper side of the insulating layer, and the seed layer covers the upper side of the insulating layer and side walls of the through opening, wherein the piezoelectric layer is deposited on the seed layer and on the first electrode layer within the through opening.

4. The manufacturing method as recited in claim 3, wherein the back-polishing is stopped on the seed layer.

5. The manufacturing method as recited in claim 4, wherein the seed layer on the first insulating layer is structured together with the second electrode layer after the back-polishing.

6. The manufacturing method as recited in claim 4, wherein the seed layer is removed after the back-polishing and the piezoelectric layer area is back-thinned.

7. The manufacturing method as recited in claim 1, further comprising depositing a second insulating layer on the first insulating layer and the first electrode layer.

8. The manufacturing method as recited in claim 7, further comprising:
    forming a first contact hole to the first electrode layer in the first and second insulating layers; and
    forming a second contact hole to the second electrode layer is formed in the second insulating layer.

9. The manufacturing method as recited in claim 7, further comprising:
    forming an additional through opening is formed in the second insulating layer to expose the second electrode layer within the additional through opening;
    forming an additional piezoelectric layer on the second insulating layer and on the second electrode layer within the additional through opening to produce a second resulting structure;
    back-polishing the resulting structure, for forming an additional planar surface, on which an additional piezoelectric layer area, surrounded by the second insulating layer, is exposed; and
    depositing and structuring on the additional planar surface a third electrode layer that contacts the additional piezoelectric layer area.

10. The manufacturing method as recited in claim 9, further comprising:
   depositing a third insulating layer on the second insulating layer and the third electrode layer.

11. The manufacturing method as recited in claim 10, further comprising:
   forming on the third electrode layer a third piezoelectric layer area that is surrounded by the third insulating layer.

12. The manufacturing method as recited in claim 9, wherein at least one of the first electrode layer, the second electrode layer, and the third electrode layer is formed as a layer stack.

13. A piezoelectric layer arrangement, comprising:
   a substrate;
   a first electrode layer situated on the substrate;
   a first insulating layer situated on the first electrode layer and including a through opening;
   a piezoelectric layer area, surrounded by the first insulating layer, on the first electrode layer within the through opening;
   a second electrode layer situated on the first insulating layer and in contact with the piezoelectric layer area; and
   a second insulating layer formed on the second electrode layer and the first insulating layer and the first electrode layer with an additional through opening.

14. The piezoelectric layer arrangement as recited in claim 13, further comprising:
   an additional piezoelectric layer area, surrounded by the second insulating layer, and formed on the second electrode layer within the additional through opening; and
   a third electrode layer formed on the second insulating layer and in contact with the additional piezoelectric layer area.

15. The piezoelectric layer arrangement as recited in claim 14, further comprising:
   a third piezoelectric layer area, surrounded by the third insulating layer, and formed on the third electrode layer.

* * * * *